United States Patent
Lagally et al.

(10) Patent No.: US 9,990,446 B2
(45) Date of Patent: Jun. 5, 2018

(54) PREDICTIVE SHIMMING FOR FLEXIBLE SURFACES

(71) Applicant: The Boeing Company, Chicago, IL (US)

(72) Inventors: Christie Dusty Lagally, Seattle, WA (US); Adriana Willempje Blom, Shoreline, WA (US); Gregory John Shish, Bothell, WA (US); Darrell D. Jones, Mill Creek, WA (US)

(73) Assignee: THE BOEING COMPANY, Chicago, IL (US)

( * ) Notice: Subject to any disclaimer, the term of this patent is extended or adjusted under 35 U.S.C. 154(b) by 1087 days.

(21) Appl. No.: 14/252,997

(22) Filed: Apr. 15, 2014

(65) Prior Publication Data
US 2015/0294032 A1 Oct. 15, 2015

(51) Int. Cl.
G06F 17/50 (2006.01)
G05B 19/4097 (2006.01)

(52) U.S. Cl.
CPC .......... *G06F 17/50* (2013.01); *G06F 17/5018* (2013.01); *G06F 17/5086* (2013.01); *G06F 17/5095* (2013.01); *G05B 19/4097* (2013.01); *Y02T 10/82* (2013.01)

(58) Field of Classification Search
CPC .. G06F 17/50; G06F 17/5095; G06F 17/5018; G06F 17/5086; Y02T 10/82; G05B 19/4097
USPC ............................................................ 703/1
See application file for complete search history.

(56) References Cited

U.S. PATENT DOCUMENTS

| | | | |
|---|---|---|---|
| 6,979,288 B2 | 12/2005 | Hazlehurst et al. | |
| 8,465,613 B2 | 6/2013 | Rotter et al. | |
| 8,655,480 B1 | 2/2014 | Odendahl et al. | |
| 8,657,274 B2 | 2/2014 | Hazlehurst et al. | |
| 2008/0205763 A1 | 8/2008 | Marsh et al. | |
| 2009/0100791 A1* | 4/2009 | Kayani | B64C 3/187 52/745.19 |

FOREIGN PATENT DOCUMENTS

EP 2533167 A2 12/2012

OTHER PUBLICATIONS

Lee et al., "Variation Analysis of Three Dimensional non-rigid Assemblies," Proceedings of the 2007 IEEE International Symposium on Assembly and Manufacturing, Jul. 2007, pp. 13-18.*

(Continued)

*Primary Examiner* — Saif A Alhija
(74) *Attorney, Agent, or Firm* — Yee & Associates, P.C.

(57) ABSTRACT

A method and apparatus for forming a number of filler members. The apparatus comprises a surface model generator and an analyzer. The surface model generator generates a first surface model of a surface and a second surface model of a flexible surface. The surface and the flexible surface are to be mated to form a mated surface and a mated flexible surface. The analyzer performs a structural analysis using the first surface model and the second surface model to identify a predicted final shape of the mated flexible surface. The predicted final shape of the mated flexible surface is used to form the number of filler members to fill a number of spaces between the mated surface and the mated flexible surface.

20 Claims, 13 Drawing Sheets

(56) References Cited

OTHER PUBLICATIONS

Extended European Search Report, dated Sep. 14, 2015, regarding Application No. EP15163378.1, 9 pages.
Fernlund et al., "Finite element based prediction of process-induced deformation of autoclaved composite structures using 2D process analysis and 3D structural analysis," Composite Structures, vol. 62, No. 2, Nov. 2003, pp. 223-234.
Canadian Intellectual Property Office Examination Report, dated Feb. 24, 2016, regarding Application No. 2,885,439, 4 pages.
De Groot, "Unusual techniques for absolute distance measurement," Society of Photo-Optical Instrumentation Engineers, Optical Engineering, vol. 40, No. 1, Jan. 2001, pp. 28-32.
Nozaki et al., "787 wing skin automatic 3D measurement system with Laser Radar," Hitachi Engineering & Services Co., Ltd., Jul. 2008, 44 pages.

\* cited by examiner

FIG. 13
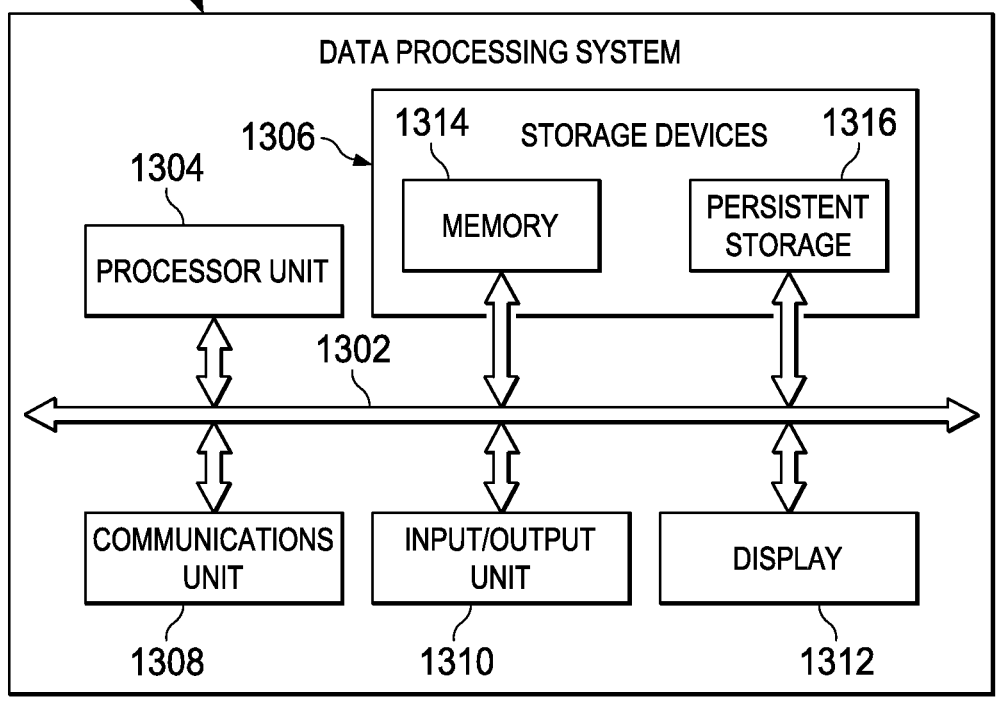
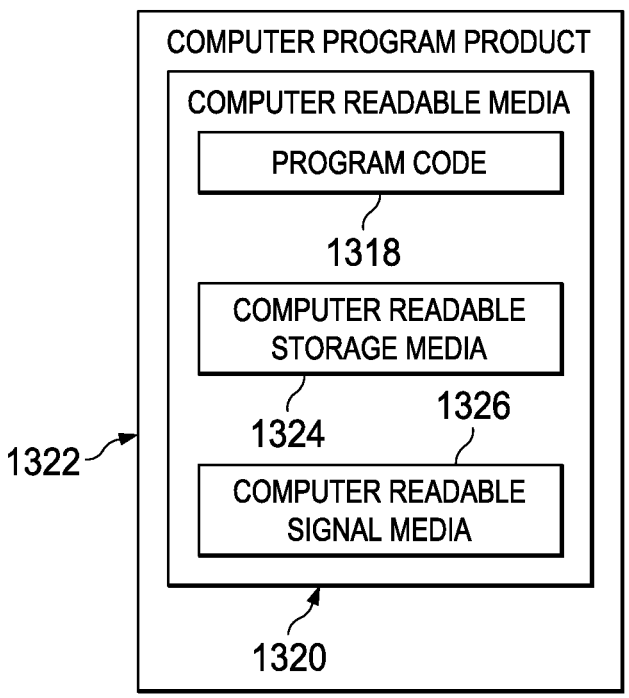

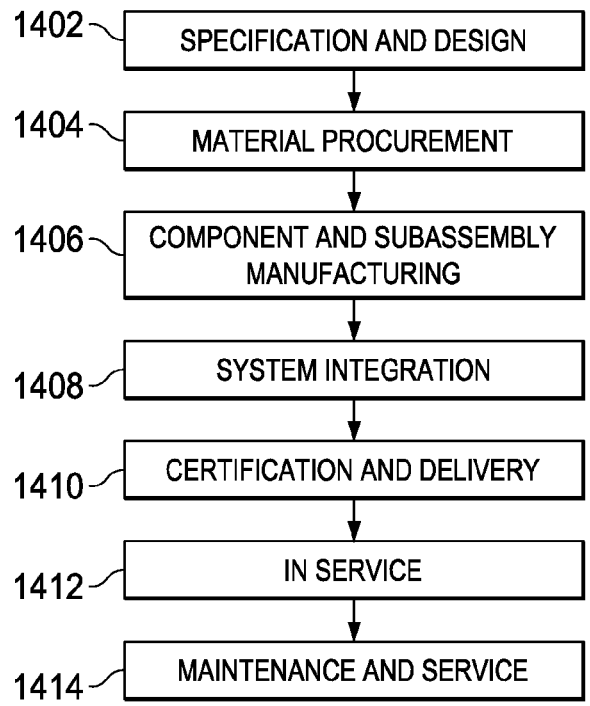
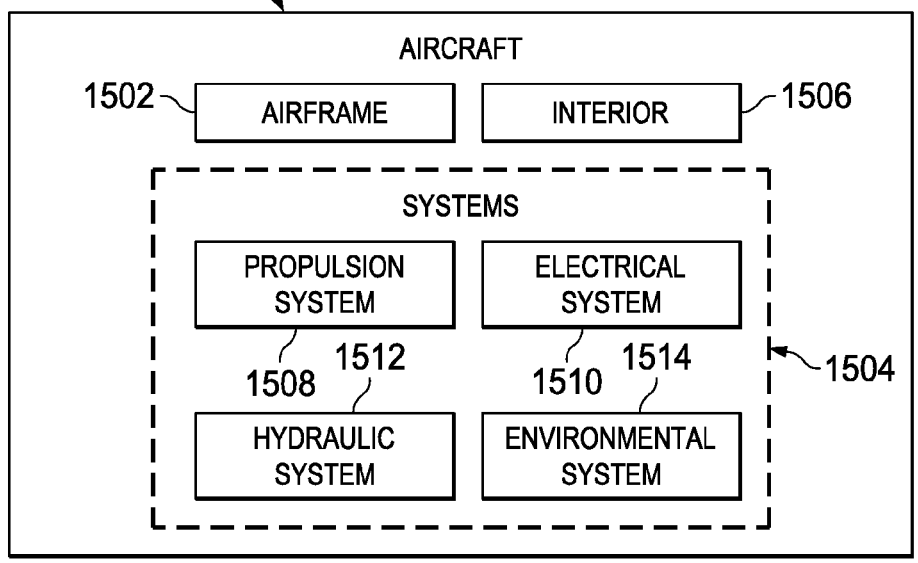

PREDICTIVE SHIMMING FOR FLEXIBLE SURFACES

BACKGROUND INFORMATION

1. Field

The present disclosure relates generally to shims and, in particular, to predicting the shapes of required shims. Still more particularly, the present disclosure relates to a method and apparatus for predicting the shapes of shims needed for filling in the space between a rigid surface and a flexible surface that have been mated.

2. Background

Various surfaces may be mated when components are attached or assembled together during the manufacturing of an object. In some cases, one or more gaps may be present between the mated surfaces. These gaps may affect the performance, aesthetic, or some other aspect of the object in an undesired manner. Thus, it may be desirable to substantially fill these gaps using, for example, shims. A shim typically takes the form of a solid member that is made of metal, plastic, a composite material, or some other type of material. The process of filling these gaps using shims is "shimming."

Some currently available methods for forming shimming work well when the mated surfaces are both rigid surfaces. The shims formed using these currently available methods may not have the desired level of accuracy when at least one of the mated surfaces is a flexible surface. For example, human operators may take manual measurements of the gaps using feeler gauges. These measurements are then used to determine the dimensions of the shims to be made. However, the very process of taking these measurements, the sequence in which the measurements are taken, or both, may cause changes in the shape of the flexible surface, which may, in turn, cause inaccuracies in the measurements.

Predictive shimming is the process of predicting the shims needed to fill the gaps between mated surfaces and, in particular, predicting the three-dimensional shapes of these shims. Predicting the three-dimensional shapes of these shims includes predicting the overall three-dimensional geometry of the shims. Shims manufactured based on some currently available methods for predictive shimming may be unable to fill these gaps within selected tolerances, fit into these gaps, or both.

For example, a rib assembly for an aircraft wing includes ribs that have shear ties. A wing skin is attached to the ribs such that a flexible surface of the wing skin is mated with a rigid surface comprised of the multiple rigid surfaces of the shear ties. Some currently available methods for predictive shimming include measuring surface geometry using, for example, a laser scanner to generate geometry information. This geometry information is then used to determine the three-dimensional shapes of the gaps that will be present between the mated surfaces.

However, the shape of the flexible surface of the wing skin may change between the time that the wing skin is scanned and the time at which the wing skin is attached to the rib assembly. For example, the wing skin may bend or flex when transported to the location where the wing assembly is to occur, when positioned relative to the rib assembly, when released from the suction cups or other retaining devices used to hold the wing skin, and/or during attachment of the wing skin to the shear ties of the ribs.

Thus, the final shape of the wing skin and thereby, the final shape of the flexible surface of the wing skin that is mated to the surface of the rib assembly, may be different from the shape determined by the scans. Consequently, the gaps may be different in shape and the shims needed to fill these gaps may be different from the shims predicted. The shims may need to be reworked, new shims may need to be made, or both. Performing these types of operations may increase the overall time, cost, and effort needed to manufacture the wing more than desired. Therefore, it would be desirable to have a method and apparatus that take into account at least some of the issues discussed above, as well as other possible issues.

SUMMARY

In one illustrative embodiment, an apparatus comprises a surface model generator and an analyzer. The surface model generator generates a first surface model of a surface and a second surface model of a flexible surface. The surface and the flexible surface are to be mated to form a mated surface and a mated flexible surface. The analyzer performs a structural analysis using the first surface model and the second surface model to identify a predicted final shape of the mated flexible surface. The predicted final shape of the mated flexible surface is used to form a number of filler members to fill a number of spaces between the mated surface and the mated flexible surface.

In another illustrative embodiment, a predictive system comprises a surface measurement system, a surface model generator, an analyzer, and a filler model generator. The surface measurement system generates first data for a rigid surface and second data for a flexible surface. The rigid surface and the flexible surface are to be mated to become a mated rigid surface and a mated flexible surface. The surface model generator generates a first surface model of the rigid surface using the first data and a second surface model of the flexible surface using the second data. The analyzer performs a structural analysis using the first surface model and the second surface model to identify a predicted final shape of the mated flexible surface within selected tolerances. The filler model generator subtracts a shape of the mated rigid surface from the predicted final shape of the mated flexible surface to identify three-dimensional shape information for a number of spaces. The filler model generator generates a number of filler models for a number of filler members to be used to fill the number of spaces present between the mated rigid surface and the mated flexible surface based on the three-dimensional shape information.

In yet another illustrative embodiment, a method for forming a number of filler members is provided. A first surface model of a surface and a second surface model of a flexible surface are generated. The surface and the flexible surface are to be mated to form a mated surface and a mated flexible surface. A structural analysis is performed using the first surface model and the second surface model to identify a predicted final shape of the mated flexible surface. The number of filler members is formed to fill a number of spaces between the mated surface and the mated flexible surface using the predicted final shape of the mated flexible surface.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

FIG. 13 is an illustration of a data processing system in the form of a block diagram in accordance with an illustrative embodiment;

FIG. 14 is an illustration of an aircraft manufacturing and service method in the form of a block diagram in accordance with an illustrative embodiment;

FIG. 15 is an illustration of an aircraft in the form of a block diagram in which an illustrative embodiment may be implemented.

DETAILED DESCRIPTION

Figure 1:
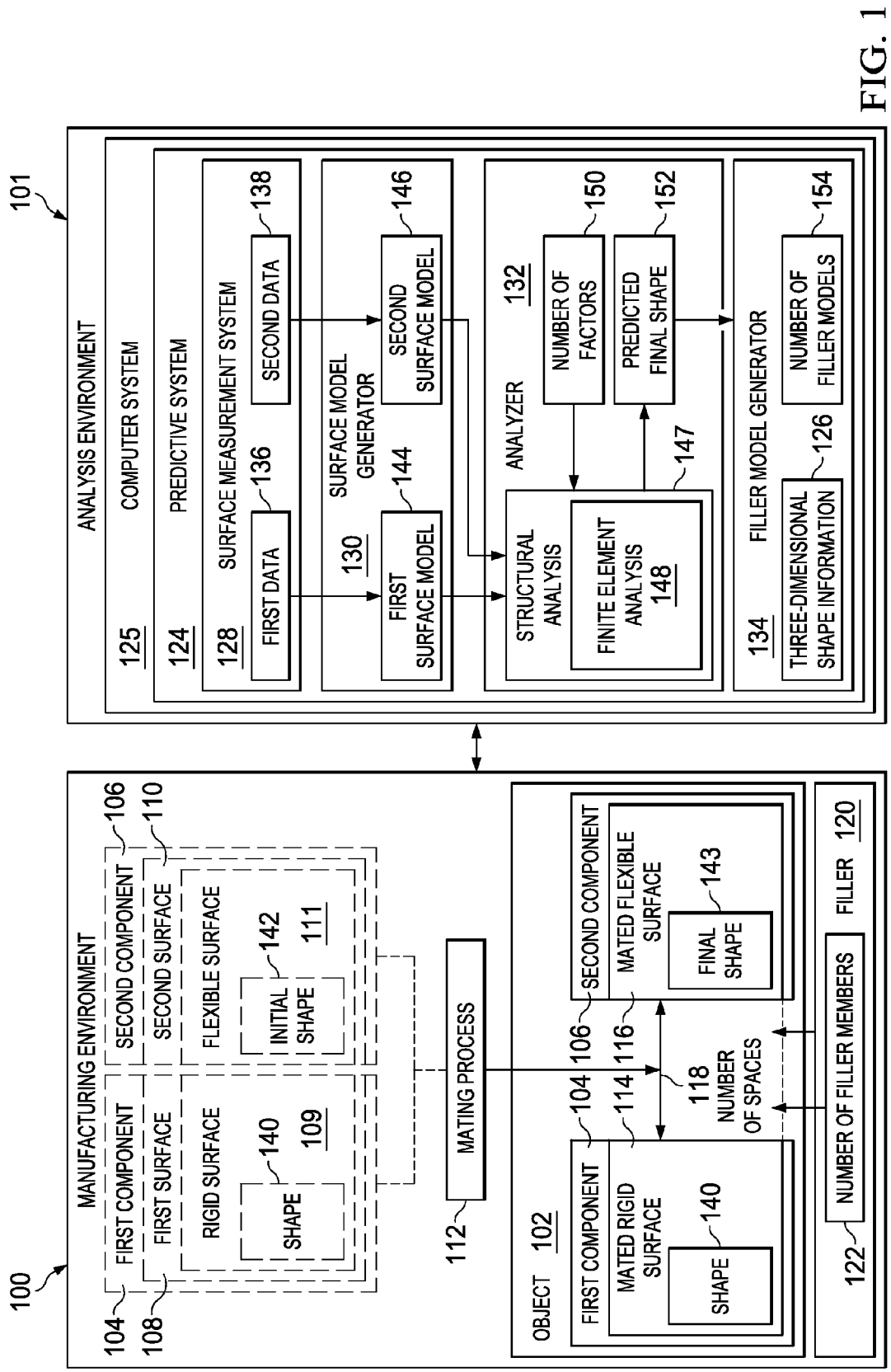
FIG. 1 is an illustration of a manufacturing environment and an analysis environment in the form of a block diagram in accordance with an illustrative embodiment.

The illustrative embodiments recognize and take into account different considerations. For example, the illustrative embodiments recognize and take into account that it may be desirable to have a method for predicting the shapes of shims needed to fill the gaps between two surfaces that have been mated in which at least one of these surfaces is a flexible surface. In particular, the illustrative embodiments recognize and take into account that it may be desirable to predict the shapes of these with a desired level of accuracy. By more accurately predicting the shapes of shims, shims may be manufactured off-site before installation. Further, the amount of rework that may need to be performed during installation of these shims may be reduced, and the need for manufacturing new shims once the shimming process has already begun may be reduced.

The illustrative embodiments also recognize and take into account that it may be desirable to at least partially automate the process of predicting shimming to reduce the number of human operators needed to measure the gaps that will be filled by the shims. Further, automating the process of predictive shimming may reduce the overall time, cost, materials, and effort needed for performing shimming tasks.

For example, the illustrative embodiments recognize and take into account that it may be desirable to have a predictive system that can generate models for the shims that will be needed. Further, it may be desirable to have an automated manufacturing system capable of manufacturing these shims based on the models of the shims such that the shims are manufactured as specified by the models with a desired level of accuracy.

Thus, the illustrative embodiments provide an apparatus, system, and method for predicting the shapes of filler members needed to fill the spaces between mated surfaces. In particular, structural analysis may be used to predict the shapes of these filler members. The structural analysis may be performed using, for example, without limitation, finite element analysis (FEA).

In one illustrative embodiment, a system includes a surface measurement system, a surface model generator, an analyzer, and a filler model generator. The surface measurement system generates first data for a rigid surface and second data for a flexible surface in which the rigid surface and the flexible surface are to be mated to form a mated rigid surface and a mated flexible surface. The surface model generator generates a first surface model of the rigid surface using the first data and a second surface model of the flexible surface using the second data. The analyzer performs a finite element analysis using the first surface model, the second surface model, and a number of factors to identify a predicted final shape of the mated flexible surface. The filler model generator uses this predicted final shape to form a filler to fill a space between the mated rigid surface and the mated flexible surface. The filler may be comprised of any number of filler members, such as shims.

Referring now to the figures and, in particular, with reference to FIG. 1, an illustration of a manufacturing environment and an analysis environment is depicted in the form of a block diagram in accordance with an illustrative embodiment. Manufacturing environment 100 and analysis environment 101 are depicted in FIG. 1. In this illustrative example, manufacturing environment 100 is an example of an environment in which object 102 may be manufactured.

Object 102 may be manufactured using at least first component 104 and second component 106. Any number of other components may also be used to form object 102. First component 104 has first surface 108 and second component 106 has second surface 110. As used herein, a "surface" may be a continuous surface or a discontinuous surface comprised of multiple surfaces.

Second component 106 may be attached to first component 104 such that second surface 110 of second component 106 is mated with first surface 108 of first component 104. In particular, first surface 108 of first component 104 and second surface 110 of second component 106 may be mated using mating process 112.

Mating process 112 may include any number of operations configured to physically attach second component 106 to first component 104 such that second surface 110 of second component 106 is mated with first surface 108 of first component 104. For example, without limitation, mating process 112 may include at least one of securing, bonding, mounting, welding, fastening, pinning, stitching, stapling, tying, gluing, or otherwise attaching first component 104 and second component 106 together.

As used herein, the phrase "at least one of," when used with a list of items, means different combinations of one or more of the listed items may be used and only one of the items in the list may be needed. The item may be a particular object, thing, action, process, or category. In other words, "at least one of" means any combination of items or number of items may be used from the list, but not all of the items in the list may be required.

For example, "at least one of item A, item B, and item C" may mean item A; item A and item B; item B; item A, item B, and item C; or item B and item C. In some cases, "at least one of item A, item B, and item C" may mean, for example, without limitation, two of item A, one of item B, and ten of item C; four of item B and seven of item C; or some other suitable combination.

At least one of first component 104 or second component 106 may be flexible such that the corresponding surface of the component is a flexible surface. In this manner, at least one of first surface 108 or second surface 110 may be a flexible surface. In this manner, a surface, which may be first surface 108, may be mated with a flexible surface, which may be second surface 110, to form a mated surface and a mated flexible surface. In some cases, first surface 108 may be a rigid surface.

As one illustrative example, first component 104 is rigid such that first surface 108 of first component 104 is also rigid. In particular, first surface 108 takes the form of rigid surface 109. First component 104 may be unable to be bent, deformed, or flexed in a manner outside of selected tolerances. Consequently, the shape of rigid surface 109 may not be changeable outside of selected tolerances.

In contrast, second component 106 is flexible such that second surface 110 of second component 106 is also flexible. In particular, second surface 110 takes the form of flexible surface 111. Second component 106 may be bent, deformed, or flexed without causing any undesired effects to second component 106 or flexible surface 111, such as cracking or tearing. Consequently, the shape of flexible surface 111 may change.

As used herein, a "shape" of a surface, such as first surface 108 or second surface 110, may include the geometry of the surface, the dimensions of the surface, and the morphology of the surface. In particular, the shape of a surface may be the three-dimensional shape of the surface.

Rigid surface 109 and flexible surface 111 may be mated by mating process 112 to form mated rigid surface 114 and mated flexible surface 116, respectively. In particular, once rigid surface 109 and flexible surface 111 have been fully mated, rigid surface 109 may be referred to as mated rigid surface 114 and flexible surface 111 may be referred to as mated flexible surface 116.

Number of spaces 118 may be present between mated rigid surface 114 and mated flexible surface 116. As used herein, a "number of" means one or more. In this manner, number of spaces 118 may include one or more spaces. A space in number of spaces 118 may also be referred to as a gap in some illustrative examples. In this manner, number of spaces 118 may also be referred to as a number of gaps.

Filler 120 may be used to substantially fill number of spaces 118 within selected tolerances. Number of filler members 122 may be used to form filler 120. In this illustrative example, number of filler members 122 may take the form of a number of shims. Depending on the implementation, a filler member in number of filler members 122 may be fabricated or otherwise manufactured using a material comprised of at least one of plastic, metal, a metal alloy, wood, a composite material, stone, or some other type of material.

In some cases, it may be desirable to manufacture number of filler members 122 before mating process 112, in a different location than where mating process 112 is performed, or both to reduce the time, cost, and effort associated with manufacturing object 102. In this illustrative example, predictive system 124 is used to predict three-dimensional shape information 126 for number of spaces 118 that will be formed between mated rigid surface 114 and mated flexible surface 116. Three-dimensional shape information 126 may include at least one of information about the number of three-dimensional shapes of number of spaces 118, dimensions for each of number of spaces 118, or other information.

Number of filler members 122 may then be manufactured based on three-dimensional shape information 126 prior to mating process 112. Number of filler members 122 may be manufactured using any number of manufacturing processes including, but not limited to, at least one of machining, cutting, bending, hammering, casting, three-dimensional printing, aerosol jet deposition, inkjet deposition, or some other type of forming process.

As depicted, predictive system 124 is located within analysis environment 101. Analysis environment 101 is in a remote location with respect to manufacturing environment 100 in this illustrative example. However, in other illustrative examples, one portion of predictive system 124 may be located within manufacturing environment 100, while another portion of predictive system 124 may be located within analysis environment 101. In still other illustrative examples, predictive system 124 may be entirely located within manufacturing environment 100.

Predictive system 124 may be implemented using software, hardware, firmware, or a combination thereof. When software is used, the operations performed by predictive system 124 may be implemented using, for example, without limitation, program code configured to run on a processor unit. When firmware is used, the operations performed by predictive system 124 may be implemented using, for example, without limitation, program code and data and stored in persistent memory to run on a processor unit.

When hardware is employed, the hardware may include one or more circuits that operate to perform the operations performed by predictive system 124. Depending on the implementation, the hardware may take the form of a circuit system, an integrated circuit, an application specific integrated circuit (ASIC), a programmable logic device, or some other suitable type of hardware device configured to perform any number of operations.

A programmable logic device may be configured to perform certain operations. The device may be permanently configured to perform these operations or may be reconfigurable. A programmable logic device may take the form of, for example, without limitation, a programmable logic array, a programmable array logic, a field programmable logic array, a field programmable gate array, or some other type of programmable hardware device.

In some illustrative examples, the operations and processes performed by predictive system 124 may be performed using organic components integrated with inorganic components. In some cases, the operations and processes may be performed by entirely organic components, excluding a human being. For example, circuits in organic semiconductors may be used to perform these operations and processes.

In this illustrative example, predictive system 124 is implemented using computer system 125. Computer system 125 may include one or more computers. When computer system 125 includes more than one computer, these computers may be in communication with each other using any number of wired, wireless, optical, or other types of communications links.

As depicted, predictive system 124 includes surface measurement system 128, surface model generator 130, analyzer 132, and filler model generator 134. Depending on the implementation, each of surface measurement system 128, surface model generator 130, analyzer 132, and filler model generator 134 may be implemented using hardware, software, or a combination of the two, as described above.

Surface measurement system 128 is used to generate first data 136 for rigid surface 109 and second data 138 for flexible surface 111. First data 136 includes data about shape 140 of rigid surface 109. Second data 138 includes data about initial shape 142 of flexible surface 111. After mating process 112, mated flexible surface 116 may have final shape 143 that is different from initial shape 142.

In one illustrative example, first data 136 and second data 138 take the form of three-dimensional point clouds. In particular, first data 136 may take the form of a first three-dimensional point cloud that has sufficient density to capture shape 140 of rigid surface 109 with a desired level of accuracy. Similarly, second data 138 may take the form of a second three-dimensional point cloud that has sufficient density to capture initial shape 142 of flexible surface 111 with a desired level of accuracy.

In one illustrative example, surface measurement system 128 takes the form of a scanning device that is used to scan rigid surface 109 to generate first data 136 and scan flexible surface 111 to generate second data 138. The scanning device may take the form of, for example, without limitation, a laser system, an optical measurement device, or some other type of system. The laser system may be, for example, a laser radar scanner. The optical measurement device may be, for example, a three-dimensional optical measurement device. In another illustrative example, surface measurement system 128 takes the form of a photogrammetry system.

Surface model generator 130 uses first data 136 and second data 138 to generate first surface model 144 for rigid surface 109 and second surface model 146 for flexible surface 111, respectively. In one illustrative example, surface model generator 130 uses first data 136 as first surface model 144 and second data 138 as second surface model 146.

In another illustrative example, surface model generator 130 projects first data 136 onto a reference surface model of rigid surface 109 to form first surface model 144 and second data 138 onto a reference surface model of flexible surface 111 to form second surface model 146. These reference surface models may be, for example, without limitation, computer-aided design (CAD) models. The projection of the data onto the reference surface models may be performed using, for example, conformal mapping techniques.

Analyzer 132 performs structural analysis 147 using first surface model 144 and second surface model 146 to identify predicted final shape 152 of mated flexible surface 116. Predicted final shape 152 may be substantially equivalent to the actual final shape 143 of mated flexible surface 116 within selected tolerances.

In this illustrative example, analyzer 132 may perform structural analysis 147 using finite element analysis 148 and number of factors 150. In particular, number of factors 150 may be used to perform finite element analysis 148.

Number of factors 150 may include at least one of, for example, without limitation, the operations involved in mating process 112, the sequence of operations performed in mating process 112, a number of forces applied to flexible surface 111 during mating process 112, loads applied to flexible surface 111 during the formation and shaping of flexible surface 111, a number of boundary conditions, gravity, or some other factor. Still other factors in number of factors 150 may include, but are not limited to, attachment points, contact between rigid surface 109 and flexible surface 111 during and after mating process 112, the orientation of first component 104, second component 106, or both. In this manner, any factor that may affect the shape of flexible surface 111 before, during, and/or after mating process 112 may be considered in number of factors 150.

Filler model generator 134 uses predicted final shape 152 to identify three-dimensional shape information 126 for number of spaces 118. Three-dimensional shape information 126 may identify a three-dimensional shape for each of number of spaces 118 in this illustrative example. In one illustrative example, filler model generator 134 may subtract shape 140 of mated rigid surface 114 from predicted final shape 152 to identify three-dimensional shape information 126. Filler model generator 134 may then generate number of filler models 154 based on three-dimensional shape information 126.

Number of filler members 122 may then be manufactured based on number of filler models 154 such that number of filler members 122 can be used to substantially fill number of spaces 118 within selected tolerances. By manufacturing number of filler members 122 based on three-dimensional shape information 126 identified by predictive system 124, filling number of spaces 118 may be more quickly and accurately performed as compared to manufacturing number of filler members 122 based on manual measurements of number of spaces 118. As a result, the amount of rework that may be needed during shimming and the number of new shims that may be needed during shimming may be reduced.

Further, number of filler models 154 may be generated for different types of mating processes to determine which number of filler models 154 generated most accurately meets certain requirements for number of filler members 122. For example, there may be size constraints for number of filler members 122. Different types of mating processes may be analyzed using analyzer 132 to determine the proper operations, the proper sequence of operations, or both needed to ensure that number of filler models 154 meets these size constraints.

The illustration of manufacturing environment 100, analysis environment 101, and predictive system 124 in FIG. 1 is not meant to imply physical or architectural limitations to the manner in which an illustrative embodiment may be implemented. Other components in addition to or in place of the ones illustrated may be used. Some components may be optional. Also, the blocks are presented to illustrate some functional components. One or more of these blocks may be combined, divided, or combined and divided into different blocks when implemented in an illustrative embodiment.

In some illustrative examples, both first surface 108 and second surface 110 may be flexible surfaces. Thus, after mating process 112 has been performed, first surface 108 and second surface 110 may both be referred to as mated flexible surfaces. In some cases, some other type of analysis technique may be used to implement structural analysis 147 other than finite element analysis 148. For example, structural analysis 147 may be performed using at least one of finite element analysis, finite difference methods, closed-form analysis, or some other type of structural analysis technique. Further, structural analysis 147 may be performed using number of factors 150.

Further, although surface model generator 130 and filler model generator 134 are shown separately in FIG. 1, surface model generator 130 and filler model generator 134 may be part of the same model generator in some illustrative examples. In other illustrative examples, analyzer 132 may be used to identify three-dimensional shape information 126 and filler model generator 134 may only be used to generate number of filler models 154 for number of filler members 122 based on three-dimensional shape information 126.

Figure 2:
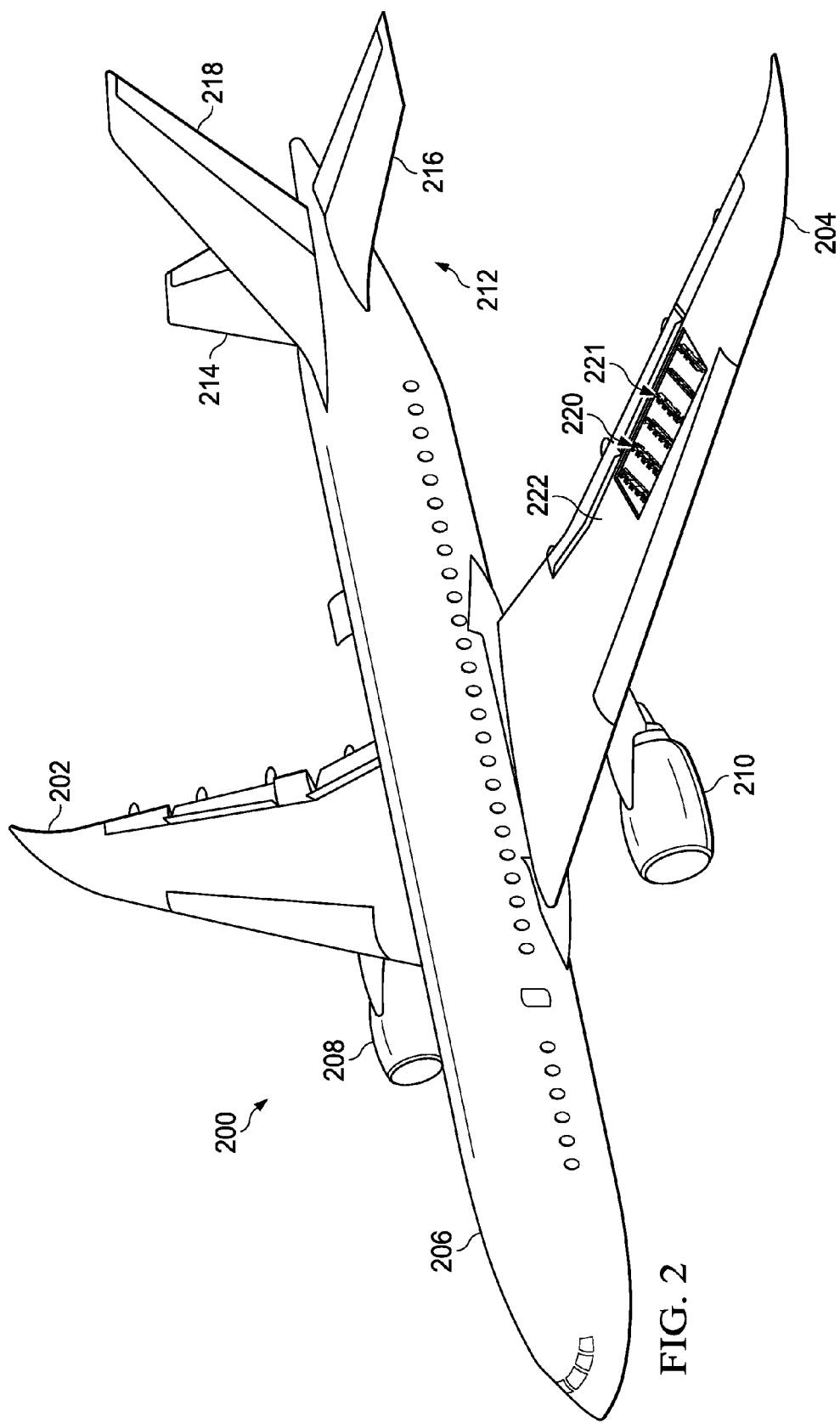
FIG. 2 is an illustration of an aircraft in accordance with an illustrative embodiment.

With reference now to FIG. 2, an illustration of an aircraft is depicted in accordance with an illustrative embodiment. In this illustrative example, aircraft 200 has wing 202 and wing 204 attached to body 206. Aircraft 200 includes engine 208 attached to wing 202 and engine 210 attached to wing 204. Body 206 has tail section 212. Horizontal stabilizer 214, horizontal stabilizer 216, and vertical stabilizer 218 are attached to tail section 212 of body 206.

Wing 204 of aircraft 200 is an example of one implementation of object 102 in FIG. 1. A portion of wing 204 has been cutaway to expose a portion of wing structure 220 of wing 204. Wing structure 220 may be referred to as a wing box in other illustrative examples.

Wing structure 220 includes rib assembly 221. Panel 222 is attached to rib assembly 221. Panel 222 may also be referred to as a skin or a wing skin. Rib assembly 221 is an example of one implementation of first component 104 in FIG. 1. Panel 222 is an example of one implementation of second component 106 in FIG. 1.

Figure 3:
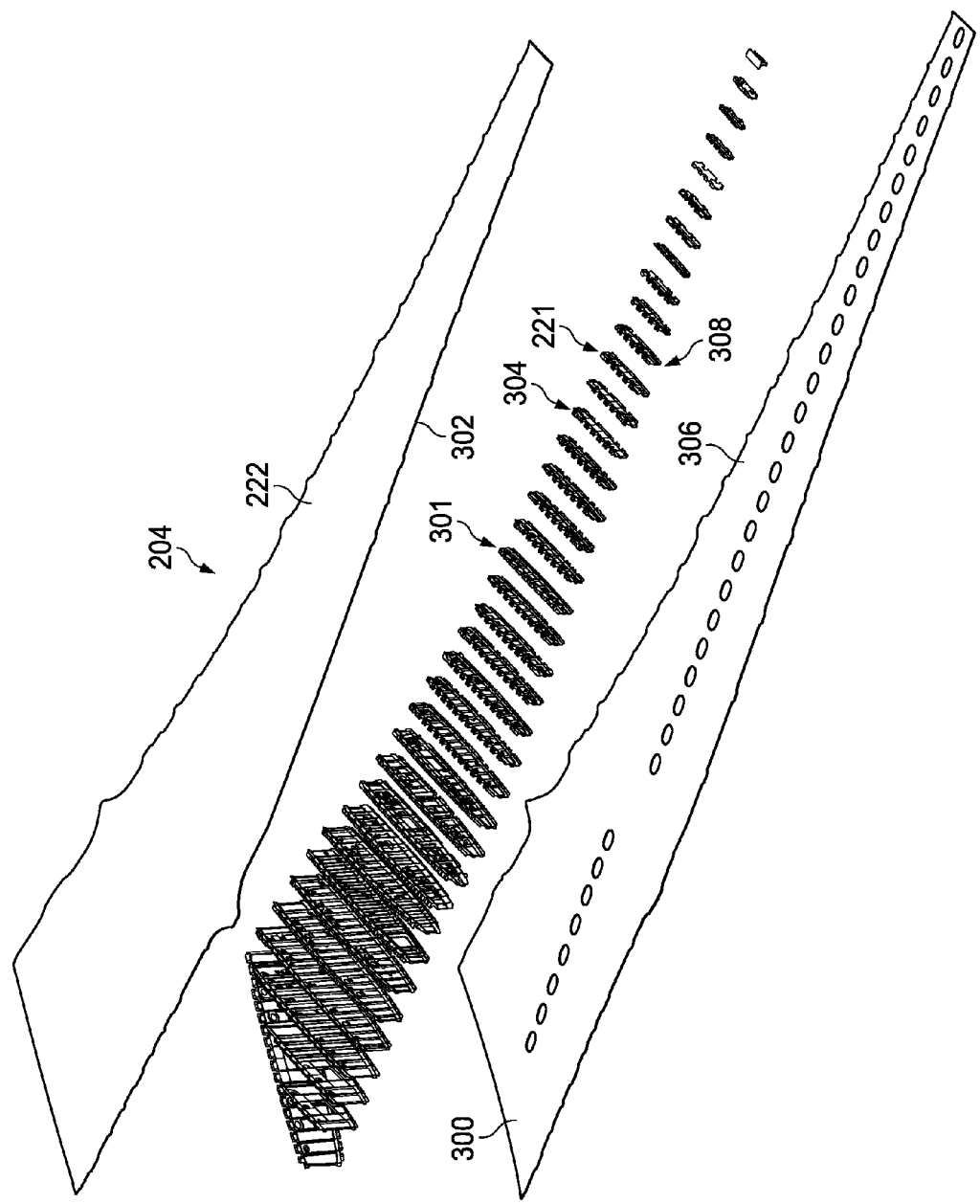
FIG. 3 is an illustration of an exploded view of a portion of a wing in accordance with an illustrative embodiment.

With reference now to FIG. 3, an illustration of an exploded view of a portion of wing 204 from FIG. 2 is depicted in accordance with an illustrative embodiment. In this illustrative example, rib assembly 221, panel 222, and panel 300 are shown. As depicted, rib assembly 221 includes plurality of ribs 301.

As depicted, panel 222 has flexible surface 302, which may be mated with rigid surface 304 of rib assembly 221. Rigid surface 304 is a discontinuous rigid surface in this illustrative example. Further, panel 300 has flexible surface 306, which may be mated with rigid surface 308 of rib assembly 221. Rigid surface 308 is a discontinuous rigid surface formed by multiple smaller surfaces in this illustrative example.

Flexible surface 302 and flexible surface 306 are examples of implementations for flexible surface 111 in FIG. 1. Rigid surface 304 and rigid surface 308 are examples of implementations for rigid surface 109 in FIG. 1.

Figure 4:
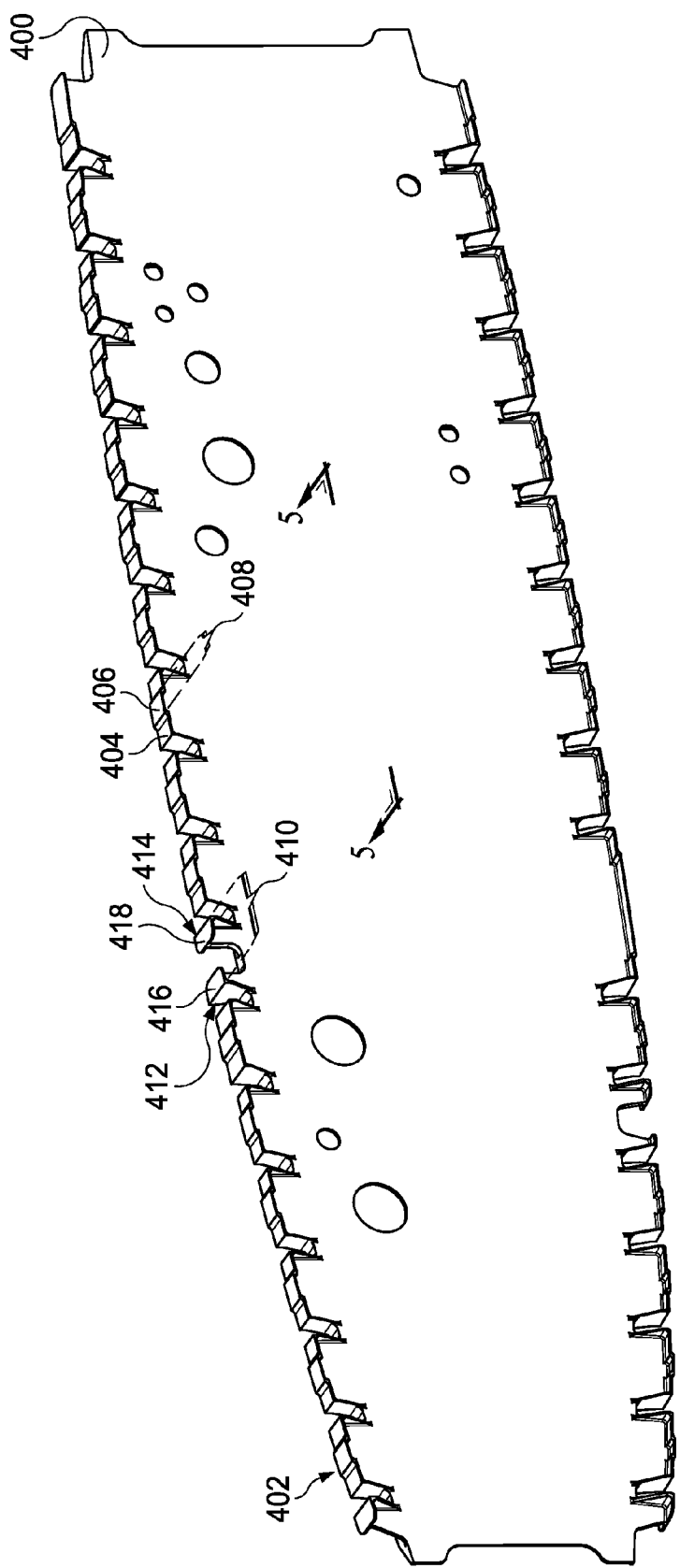
FIG. 4 is an isometric view of a rib in a rib assembly in accordance with an illustrative embodiment.

With reference now to FIG. 4, an isometric view of a rib in rib assembly 221 in FIGS. 2-3 is depicted in accordance with an illustrative embodiment. In this illustrative example, rib 400 is an example of one of plurality of ribs 301 in FIG. 3. Rib 400 has plurality of shear ties 402.

Each of plurality of shear ties 402 has at least one surface that forms rigid surface 308 shown in FIG. 3. Shear tie 404 is an example of one of plurality of shear ties 402. As depicted, shear tie 404 has surface 406. Panel 222 shown in FIGS. 2-3 may be attached to shear tie 404 to mate flexible surface 302 of panel 222 to surface 406 at a selected portion of shear tie 404. This selected portion of shear tie 404 may be referred to as cap 408 of shear tie 404. In particular, panel 222 may be tacked to cap 408 to mate flexible surface 302 of panel 222 with surface 406.

Shear tie 410 is another example of one of plurality of shear ties 402. Shear tie 410 includes flange 412 and flange 414. Flange 412 has surface 416 and flange 414 has surface 418. Panel 222 shown in FIGS. 2-3 may be attached to flange 412 and flange 414 to mate panel 222 to surface 416 and surface 418, respectively. In particular, panel 222 may be tacked to flange 412 and flange 414 to mate panel 222 to surface 416 and surface 418, respectively.

Figure 5:
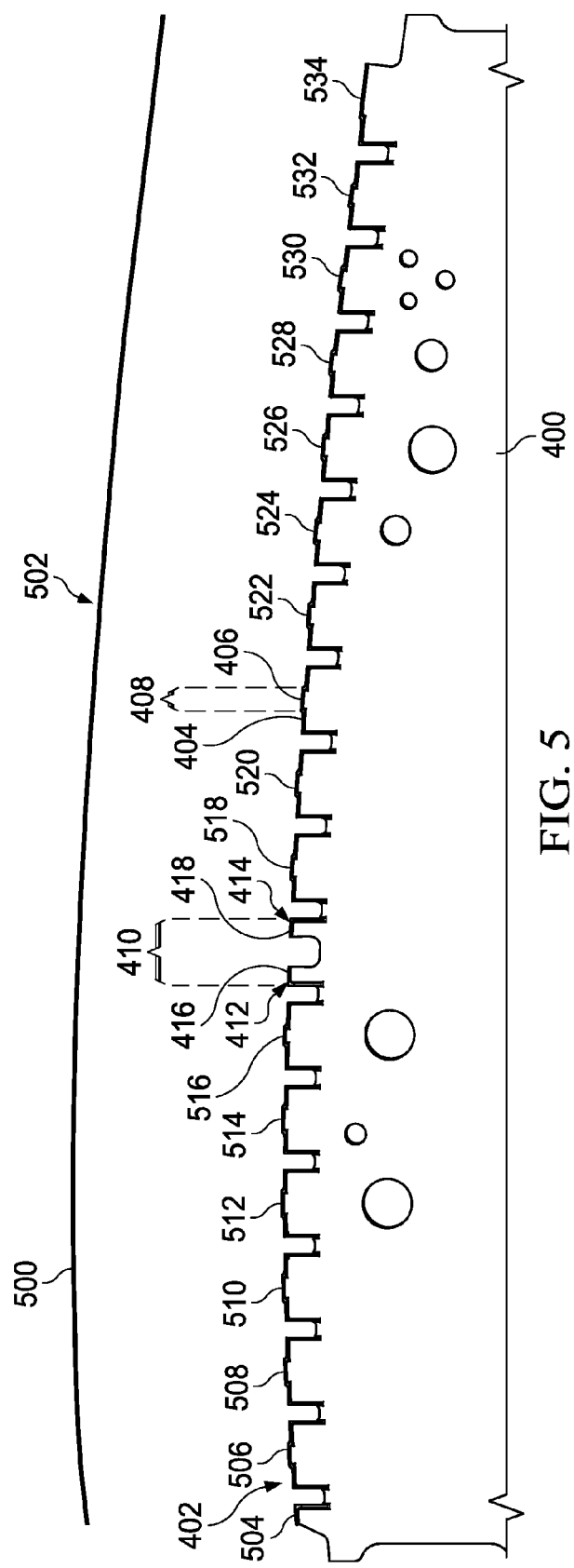
FIG. 5 is an illustration of a front view of a rib in accordance with an illustrative embodiment.

With reference now to FIG. 5, an illustration of a front view of rib 400 from FIG. 4 is depicted in accordance with an illustrative embodiment. In this illustrative example, surface line 500 indicates cross-sectional shape 502 of the portion of flexible surface 302 shown in FIG. 3 to be mated to the surfaces of plurality of shear ties 402.

In particular, in addition to being mated to surface 406, surface 416, and surface 418 in the manner described in FIG. 5, this portion of flexible surface 302 from FIG. 4 may also be mated to surfaces 504, 506, 508, 510, 512, 514, 516, 518, 520, 522, 524, 526, 528, 530, 532, and 534. In particular, flexible surface 302 may be fastened to these surfaces using any number of fastener devices or elements. For example, at least one of tacks, pins, nails, screws, bolts, or some other type of fastener device may be used to fasten flexible surface 302 to surfaces 504, 506, 508, 510, 512, 514, 516, 518, 520, 522, 524, 526, 528, 530, 532, and 534. Fastening flexible surface 302 to these surfaces, as well as gravity and other factors, may cause cross-sectional shape 502 indicated by surface line 500 to change.

A predictive system, such as predictive system 124 in FIG. 1, may be used to predict the final shape of the portion of flexible surface 302 after fastening has been performed. Further, the predictive system may be used to determine the shapes of filler members, such as shims, that will be needed to substantially fill any undesired spaces between flexible surface 302 and the surfaces of plurality of shear ties 402.

These undesired spaces may need to be filled to maintain the desired or selected aerodynamic profile for wing 204. If these spaces are not substantially filled within selected tolerances, the loads applied to panel 222 during flight of aircraft 200 may cause panel 222 to deform in an undesired manner at the locations of these spaces, which may, in turn, change the aerodynamic profile of wing 204 in an undesired manner.

With reference now to FIGS. 6-9, illustrations of a process for predicting the shapes of filler members and manufacturing filler members are depicted in accordance with an illustrative embodiment. The steps described in FIGS. 6-9 may be implemented using, for example, predictive system 124 in FIG. 1.

Figure 6:
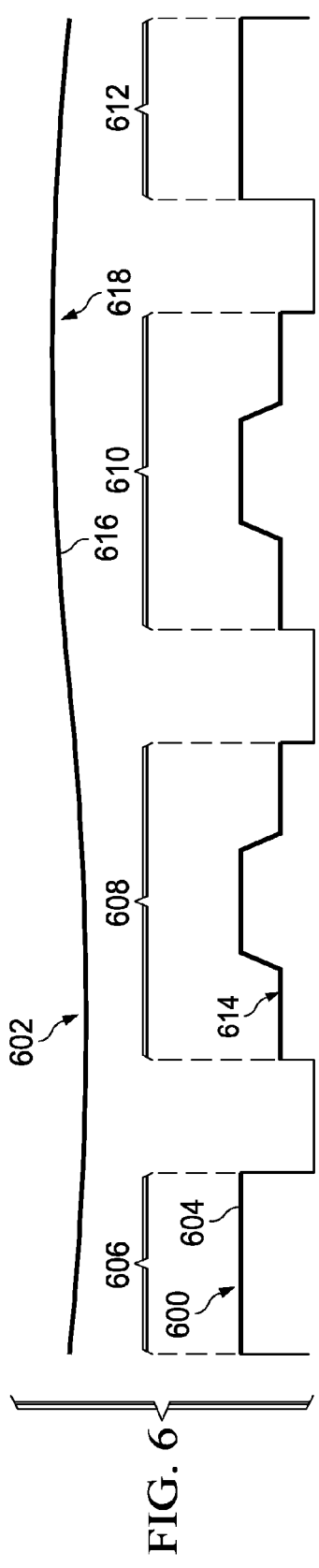
FIG. 6 is an illustration of a first surface model and a second surface model in accordance with an illustrative embodiment.

Turning now to FIG. 6, an illustration of a first surface model and a second surface model is depicted in accordance with an illustrative embodiment. In this illustrative example, first surface model 600 and second surface model 602 are examples of implementations for first surface model 144 and second surface model 146, respectively, in FIG. 1. Although first surface model 600 and second surface model 602 appear two-dimensional in FIG. 6 because of the view shown, these surface models are three-dimensional.

First surface model 600 may have been generated by a surface model generator, such as surface model generator 130 in FIG. 1, based on first data for a rigid surface, such as rigid surface 109 in FIG. 1. This first data may have been, for example, without limitation, a three-dimensional point cloud generated using a surface measurement system, such as surface measurement system 128 in FIG. 1. In this illustrative example, first surface model 600 includes rigid surface 604, which represents a physical rigid surface, such as rigid surface 109 in FIG. 1. Rigid surface 604 includes portion 606, portion 608, portion 610, and portion 612. As depicted, rigid surface 604 has shape 614.

Second surface model 602 may have been generated by a surface model generator, such as surface model generator 130 in FIG. 1, based on second data for a flexible surface, such as flexible surface 111 in FIG. 1. This second data may have been, for example, without limitation, a three-dimensional point cloud generated using a surface measurement system, such as surface measurement system 128 in FIG. 1. Second surface model 602 has flexible surface 616, which represents a physical flexible surface, such as flexible surface 111 in FIG. 1. Flexible surface 616 has initial shape 618.

Figure 7:
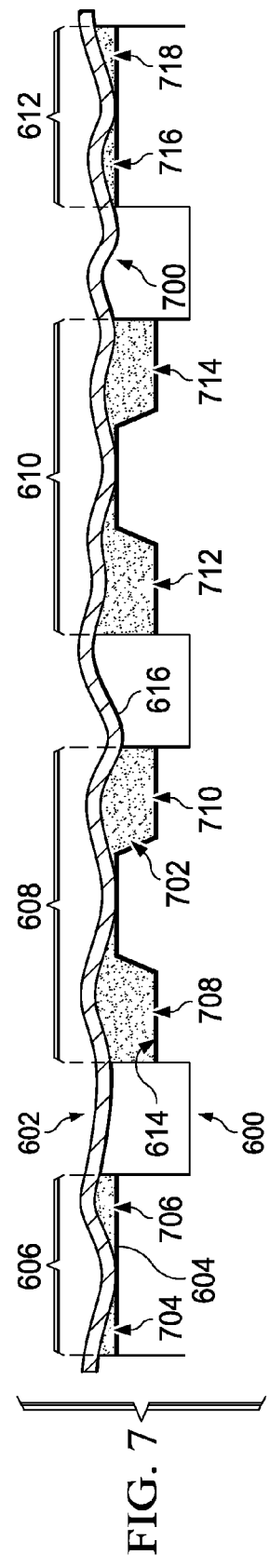
FIG. 7 is an illustration of a first surface model and a second surface model positioned relative to each other in accordance with an illustrative embodiment.

With reference now to FIG. 7, an illustration of first surface model 600 and second surface model 602 from FIG. 6 positioned relative to each other is depicted in accordance with an illustrative embodiment. In this illustrative example, an analyzer, such as analyzer 132 in FIG. 1, may "virtually" position second surface model 602 relative to first surface model 600.

The analyzer may then perform a finite element analysis based on the mating process that will be used to mate the physical rigid surface represented by rigid surface 604 of first surface model 600 and the physical flexible surface represented by flexible surface 616 of second surface model 602. In particular, the finite element analysis may take into account the forces, including reaction forces, that will be applied to the physical flexible surface during the mating process. Other factors, such as gravity, may also be taken into account in the finite element analysis.

Based on this finite element analysis, initial shape 618 of flexible surface 616 from FIG. 6 changes based on the mating process. However, shape 614 of rigid surface 604 may not change. The analyzer predicts the final shape that the physical flexible surface will have as predicted final shape 700.

A filler model generator, such as filler model generator 134 in FIG. 1, may subtract shape 614 of rigid surface 604 from predicted final shape 700 of flexible surface 616 to identify number of spaces 702. Number of spaces 702 represents the number of spaces that will be present between the physical mated rigid surface and the physical mated flexible surface. Number of spaces 702 includes space 704, space 706, space 708, space 710, space 712, space 714, space 716, and space 718. The filler model generator may then identify three-dimensional shape information for forming a number of filler members based on number of spaces 702.

Figure 8:
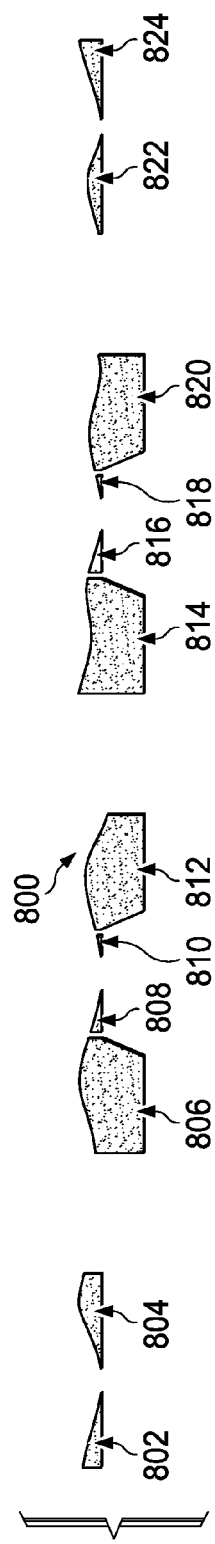
FIG. 8 is an illustration of a front view of a number of three-dimensional shapes in accordance with an illustrative embodiment.

With reference now to FIG. 8, an illustration of a front view of a number of three-dimensional shapes is depicted in accordance with an illustrative embodiment. In this illustrative example, number of three-dimensional shapes 800 may be an example of a number of shapes that may be identified in three-dimensional shape information 126 in FIG. 1.

Number of three-dimensional shapes 800 may be identified by the filler model generator based on number of spaces 702 in FIG. 7. As depicted, number of three-dimensional shapes 800 includes shape 802, shape 804, shape 806, shape 808, shape 810, shape 812, shape 814, shape 816, shape 818, shape 820, shape 822, and shape 824. Shape 802, shape 804, shape 806, shape 808, shape 810, shape 812, shape 814, shape 816, shape 818, shape 820, shape 822, and shape 824 are all three-dimensional shapes, although these shapes appear two-dimensional in this front view.

Shape 802, shape 804, shape 822, and shape 824 may be the shapes used to form filler members that will be used to fill the physical spaces represented by space 704, space 706, space 716, and space 718, respectively, in FIG. 7. Shape 806 and shape 808 may be the shapes used to form two filler members that will be used to fill the physical space represented by space 708 in FIG. 7. Shape 810 and shape 812 may be the shapes used to form two filler members that will be used to fill the physical space represented by space 710 in FIG. 7.

Similarly, shape 814 and shape 816 may be the shapes used to form two filler members that will be used to fill the physical space represented by space 712 in FIG. 7. Similarly, shape 818 and shape 820 may be the shapes used to form two filler members that will be used to fill the physical space represented by space 714 in FIG. 7.

Figure 9:
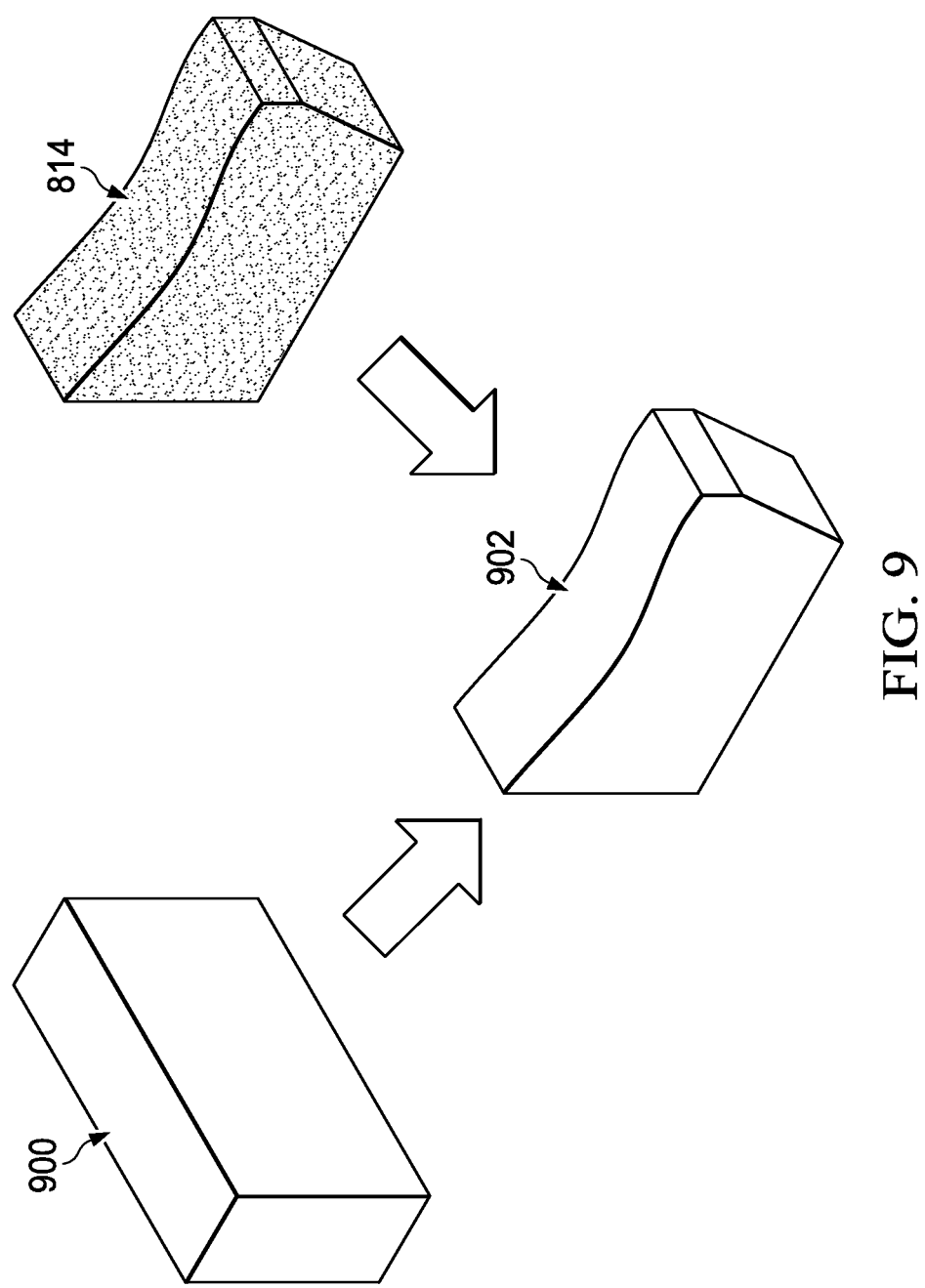
FIG. 9 is an illustration of a workpiece that is machined to form a filler member in accordance with an illustrative embodiment.

With reference now to FIG. 9, an illustration of a workpiece that is machined to form a filler member is depicted in accordance with an illustrative embodiment. In this illustrative example, a filler member may be manufactured using workpiece 900. Workpiece 900 may be machined based on shape 814 from FIG. 8 to form filler member 902. Filler member 902 may be used to substantially fill a portion of the physical space represented by space 712 in FIG. 7 within selected tolerances.

The illustrations of aircraft 200 in FIG. 2, wing 204 in FIG. 3, rib 400 in FIGS. 4-5, and filler member 902 in FIG. 9 are not meant to imply physical or architectural limitations to the manner in which an illustrative embodiment may be implemented. Other components in addition to or in place of the ones illustrated may be used. Some components may be optional.

The different components shown in FIGS. 2-5 and FIG. 9 may be illustrative examples of how components shown in block form in FIG. 1 can be implemented as physical structures. Additionally, some of the components in FIGS. 2-5 and FIG. 9 may be combined with components in FIG. 1, used with components in FIG. 1, or a combination of the two.

The different components shown in FIGS. 2-5 and FIG. 9 may be illustrative examples of how components shown in block form in FIG. 1 can be implemented as physical structures. Additionally, some of the components in FIGS. 2-5 and FIG. 9 may be combined with components in FIG. 1, used with components in FIG. 1, or a combination of the two.

Further, the illustrations of first surface model 600 and second surface model 602 in FIGS. 6-7, number of three-dimensional shapes 800 in FIG. 8, and shape 814 in FIG. 9 are not meant to impose any limitations on the types of surface models that may be generated or the types of shapes that may be identified. FIGS. 6-9 are meant to be illustrative.

Figure 10:
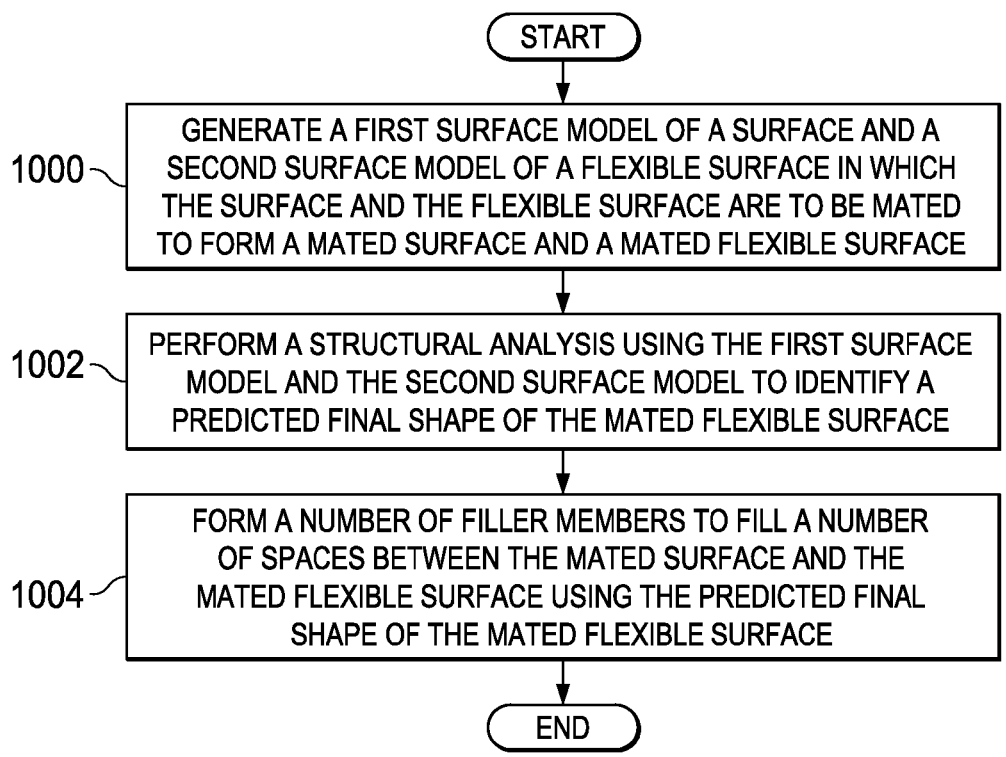
FIG. 10 is an illustration of a process for forming a number of filler members in the form of a flowchart in accordance with an illustrative embodiment.

With reference now to FIG. 10, an illustration of a process for forming a number of filler members is depicted in the form of a flowchart in accordance with an illustrative embodiment. The process illustrated in FIG. 10 may be implemented to form number of filler members 122 in FIG. 1. Further, this process may be implemented using predictive system 124 in FIG. 1.

The process begins by generating a first surface model of a surface and a second surface model of a flexible surface in which the surface and the flexible surface are to be mated to form a mated surface and a mated flexible surface (operation 1000). In one illustrative example, the surface is a rigid surface such that the mated surface is a mated rigid surface.

Next, a structural analysis is performed using the first surface model and the second surface model to identify a predicted final shape of the mated flexible surface (operation 1002). In operation 1002, the structural analysis may be performed using finite element analysis in one illustrative example.

Thereafter, a number of filler members to fill a number of spaces between the mated surface and the mated flexible surface is formed using the predicted final shape of the mated flexible surface (operation 1004), with the process terminating thereafter. The number of filler members formed in operation 1004 may be formed with a desired level of accuracy.

Figure 11:
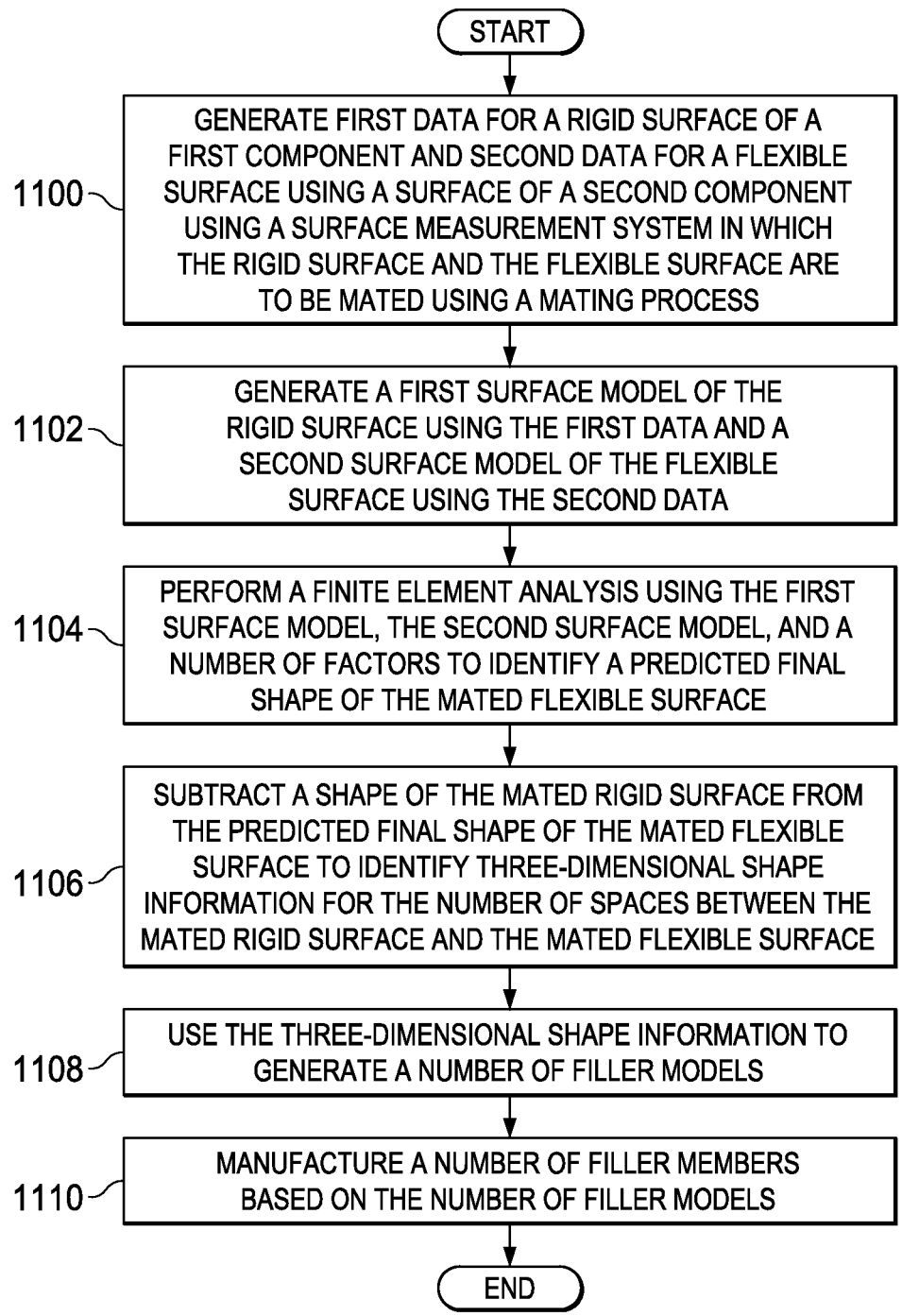
FIG. 11 is an illustration of a more detailed process for forming a number of filler members in the form of a flowchart in accordance with an illustrative embodiment.

With reference now to FIG. 11, an illustration of a more detailed process for forming a number of filler members is depicted in the form of a flowchart in accordance with an illustrative embodiment. The process illustrated in FIG. 11 may be implemented to form number of filler members 122 in FIG. 1. Further, this process may be implemented using predictive system 124 in FIG. 1.

The process begins by generating first data for a rigid surface of a first component and second data for a flexible surface of a second component using a surface measurement system in which the rigid surface and the flexible surface are to be mated using a mating process (operation 1100). Next, a first surface model of the rigid surface is generated using the first data and a second surface model of the flexible surface using the second data (operation 1102).

A finite element analysis is performed using the first surface model, the second surface model, and a number of factors to identify a predicted final shape of the mated flexible surface (operation 1104). In operation 1104, the number of factors may include at least one of the sequence of operations performed in the mating process used to mate the flexible surface and the rigid surface, a number of forces applied to the flexible surface during the mating process, loads applied to the flexible surface during the formation and shaping of the flexible surface, a number of boundary conditions, gravity, attachment points, contact between the rigid surface and the flexible surface during and after the mating process, the orientation of the first component, the second component, or both, or some other factor.

Thereafter, a shape of the mated rigid surface is subtracted from the predicted final shape of the mated flexible surface to identify three-dimensional shape information for the number of spaces between the mated rigid surface and the mated flexible surface (operation 1106). The three-dimensional shape information is used to generate a number of filler models (operation 1108). In some cases, more than one filler model may be generated for a particular shape in the three-dimensional shape information. A number of filler members are then manufactured based on the number of filler models (operation 1110), with the process terminating thereafter. In some cases, more than one filler member may be used to fill a particular space in the number of spaces.

Figure 12:
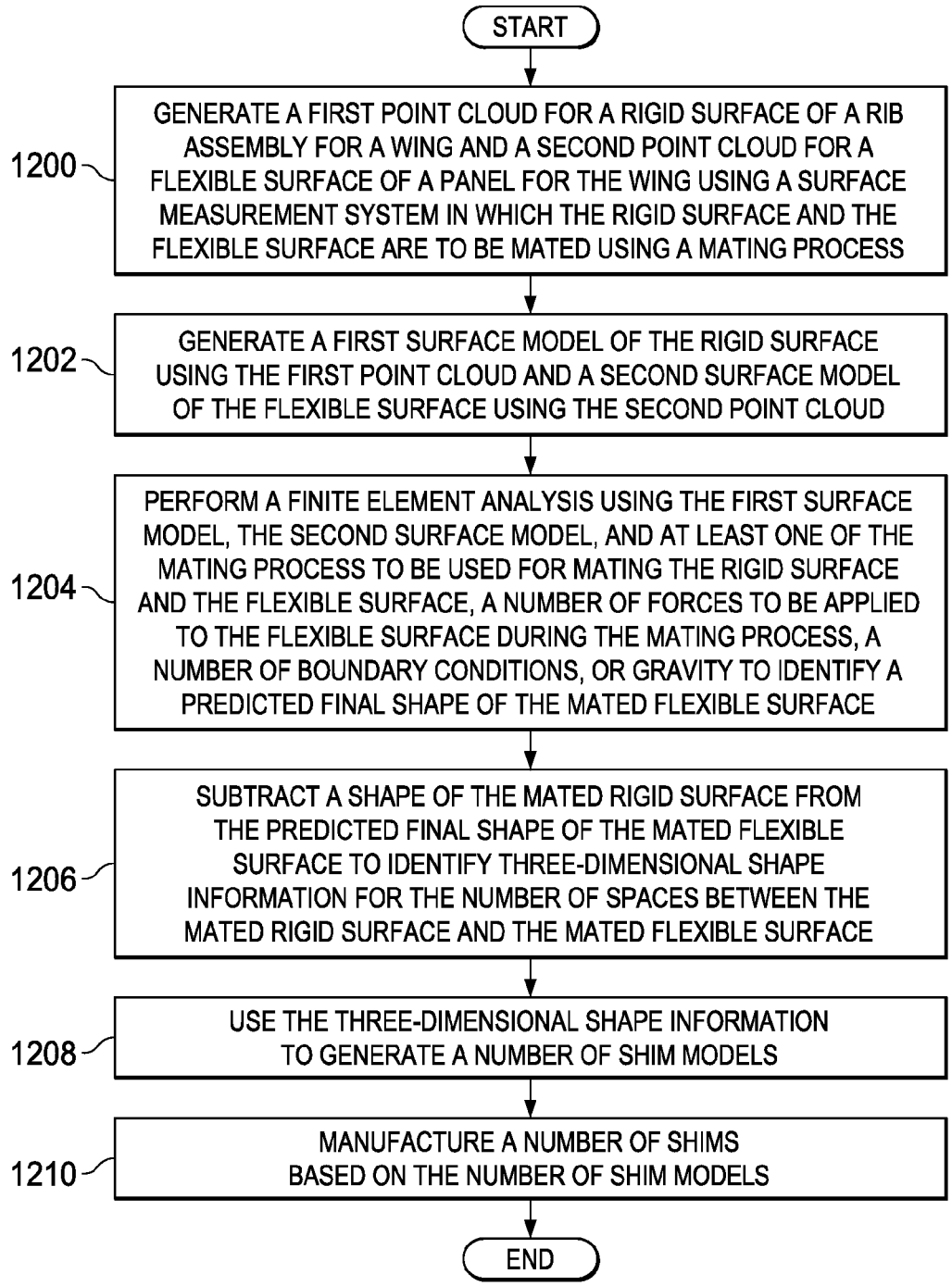
FIG. 12 is an illustration of a process for forming a number of shims for a wing of an aircraft in the form of a flowchart in accordance with an illustrative embodiment.

With reference now to FIG. 12, an illustration of a process for forming a number of shims for a wing of an aircraft is depicted in the form of a flowchart in accordance with an illustrative embodiment. The process illustrated in FIG. 12 may be implemented to form number of filler members 122 in FIG. 1 in the form of a number of shims. Further, this process may be implemented using predictive system 124 in FIG. 1.

The process begins by generating a first point cloud for a rigid surface of a rib assembly for a wing and a second point cloud for a flexible surface of a panel for the wing using a surface measurement system in which the rigid surface and the flexible surface are to be mated using a mating process (operation 1200). In operation 1200, the flexible surface of the panel may be mated to the rigid surface of the rib assembly by being tacked to the rigid surface.

Next, a first surface model of the rigid surface is generated using the first point cloud and a second surface model of the flexible surface is generated using the second point cloud (operation 1202). A finite element analysis is performed using the first surface model, the second surface model, and at least one of the mating process to be used for mating the rigid surface and the flexible surface, a number of forces to be applied to the flexible surface during the mating process, a number of boundary conditions, or gravity to identify a predicted final shape of the mated flexible surface (operation 1204).

Thereafter, a shape of the mated rigid surface is subtracted from the predicted final shape of the mated flexible surface to identify three-dimensional shape information for the number of spaces between the mated rigid surface and the mated flexible surface (operation 1206). The three-dimensional shape information is used to generate a number of shim models (operation 1208).

A number of shims are then manufactured based on the number of shim models (operation 1210), with the process terminating thereafter. The shims manufactured in operation 1210 may then be used to fill in the number of spaces that will be present after the mating process has been performed to mate the flexible surface of the panel to the rigid surface of the rib assembly.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent a module, a segment, a function, a portion of an operation or step, some combination thereof.

In some alternative implementations of an illustrative embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

Turning now to FIG. 13, an illustration of a data processing system is depicted in the form of a block diagram in accordance with an illustrative embodiment. Data processing system 1300 may be used to implement predictive system 124 in FIG. 1. For example, data processing system 1300 may be used to implement computer system 125 in FIG. 1. In some cases, data processing system 1300 may be used to implement at least a portion of each of surface measurement system 128, surface model generator 130, analyzer 132, and filler model generator 134 in FIG. 1.

As depicted, data processing system 1300 includes communications framework 1302, which provides communications between processor unit 1304, storage devices 1306, communications unit 1308, input/output unit 1310, and display 1312. In some cases, communications framework 1302 may be implemented as a bus system.

Processor unit 1304 is configured to execute instructions for software to perform a number of operations. Processor unit 1304 may comprise at least one of a number of processors, a multi-processor core, or some other type of processor, depending on the implementation. In some cases, processor unit 1304 may take the form of a hardware unit, such as a circuit system, an application specific integrated circuit (ASIC), a programmable logic device, or some other suitable type of hardware unit.

Instructions for the operating system, applications and programs run by processor unit 1304 may be located in storage devices 1306. Storage devices 1306 may be in communication with processor unit 1304 through communications framework 1302. As used herein, a storage device, also referred to as a computer readable storage device, is any piece of hardware capable of storing information on a temporary basis, a permanent basis, or both. This information may include, but is not limited to, data, program code, other information, or some combination thereof.

Memory 1314 and persistent storage 1316 are examples of storage devices 1306. Memory 1314 may take the form of, for example, a random access memory or some type of volatile or non-volatile storage device. Persistent storage 1316 may comprise any number of components or devices. For example, persistent storage 1316 may comprise a hard drive, a flash memory, a rewritable optical disk, a rewritable magnetic tape, or some combination of the above. The media used by persistent storage 1316 may or may not be removable.

Communications unit 1308 allows data processing system 1300 to communicate with other data processing systems, devices, or both. Communications unit 1308 may provide communications using physical communications links, wireless communications links, or both.

Input/output unit 1310 allows input to be received from and output to be sent to other devices connected to data processing system 1300. For example, input/output unit 1310 may allow user input to be received through a keyboard, a mouse, some other type of input device, or a combination thereof. As another example, input/output unit 1310 may allow output to be sent to a printer connected to data processing system 1300.

Display 1312 is configured to display information to a user. Display 1312 may comprise, for example, without limitation, a monitor, a touch screen, a laser display, a holographic display, a virtual display device, some other type of display device, or a combination thereof.

In this illustrative example, the processes of the different illustrative embodiments may be performed by processor unit 1304 using computer-implemented instructions. These instructions may be referred to as program code, computer usable program code, or computer readable program code and may be read and executed by one or more processors in processor unit 1304.

In these examples, program code 1318 is located in a functional form on computer readable media 1320, which is selectively removable, and may be loaded onto or transferred to data processing system 1300 for execution by processor unit 1304. Program code 1318 and computer readable media 1320 together form computer program product 1322. In this illustrative example, computer readable media 1320 may be computer readable storage media 1324 or computer readable signal media 1326.

Computer readable storage media 1324 is a physical or tangible storage device used to store program code 1318 rather than a medium that propagates or transmits program code 1318. Computer readable storage media 1324 may be, for example, without limitation, an optical or magnetic disk or a persistent storage device that is connected to data processing system 1300.

Alternatively, program code 1318 may be transferred to data processing system 1300 using computer readable signal media 1326. Computer readable signal media 1326 may be, for example, a propagated data signal containing program code 1318. This data signal may be an electromagnetic signal, an optical signal, or some other type of signal that can be transmitted over physical communications links, wireless communications links, or both.

The illustration of data processing system 1300 in FIG. 13 is not meant to provide architectural limitations to the manner in which the illustrative embodiments may be implemented. The different illustrative embodiments may be implemented in a data processing system that includes components in addition to or in place of those illustrated for data processing system 1300. Further, components shown in FIG. 13 may be varied from the illustrative examples shown.

Illustrative embodiments of the disclosure may be described in the context of aircraft manufacturing and service method 1400 as shown in FIG. 14 and aircraft 1500 as shown in FIG. 15. Turning first to FIG. 14, an illustration of an aircraft manufacturing and service method is depicted in the form of a block diagram in accordance with an illustrative embodiment. During pre-production, aircraft manufacturing and service method 1400 may include specification and design 1402 of aircraft 1500 in FIG. 15 and material procurement 1404.

During production, component and subassembly manufacturing 1406 and system integration 1408 of aircraft 1500 in FIG. 15 takes place. Thereafter, aircraft 1500 in FIG. 15 may go through certification and delivery 1410 in order to be placed in service 1412. While in service 1412 by a customer, aircraft 1500 in FIG. 15 is scheduled for routine maintenance and service 1414, which may include modification, reconfiguration, refurbishment, and other maintenance or service.

Each of the processes of aircraft manufacturing and service method 1400 may be performed or carried out by at least one of a system integrator, a third party, or an operator. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to FIG. 15, an illustration of an aircraft is depicted in the form of a block diagram in which an illustrative embodiment may be implemented. In this example, aircraft 1500 is produced by aircraft manufacturing and service method 1400 in FIG. 14 and may include airframe 1502 with plurality of systems 1504 and interior 1506. Aircraft 200 in FIG. 2 is an example of one implementation for aircraft 1500. Examples of systems 1504 include one or more of propulsion system 1508, electrical system 1510, hydraulic system 1512, and environmental system 1514. Any number of other systems may be included. Although an aerospace example is shown, different illustrative embodiments may be applied to other industries, such as the automotive industry.

Apparatuses and methods embodied herein may be employed during at least one of the stages of aircraft manufacturing and service method 1400 in FIG. 14. In particular, predictive system 124 from FIG. 1 may be used to generate models for the shims that will be needed to fill in the spaces between mated surfaces of the various structures within aircraft 1500. Predictive system 124 from FIG. 1 may be used to generate the models for shims that will be used in the structures that make up aircraft 1500, interior 1506, plurality of systems 1504, or some combination thereof, depending on the implementation.

Predictive system 124 may be used during any one of the stages of aircraft manufacturing and service method 1400. For example, without limitation, predictive system 124 from FIG. 1 may be used during at least one of component and subassembly manufacturing 1406, system integration 1408, routine maintenance and service 1414, or some other stage of aircraft manufacturing and service method 1400.

In one illustrative example, components or subassemblies produced in component and subassembly manufacturing 1406 in FIG. 14 may be fabricated or manufactured in a manner similar to components or subassemblies produced while aircraft 1500 is in service 1412 in FIG. 14. As yet another example, one or more apparatus embodiments, method embodiments, or a combination thereof may be utilized during production stages, such as component and subassembly manufacturing 1406 and system integration 1408 in FIG. 14. One or more apparatus embodiments, method embodiments, or a combination thereof may be utilized while aircraft 1500 is in service 1412, during maintenance and service 1414 in FIG. 14, or both. The use of a number of the different illustrative embodiments may substantially expedite the assembly of and reduce the cost of aircraft 1500.

Figure 16:
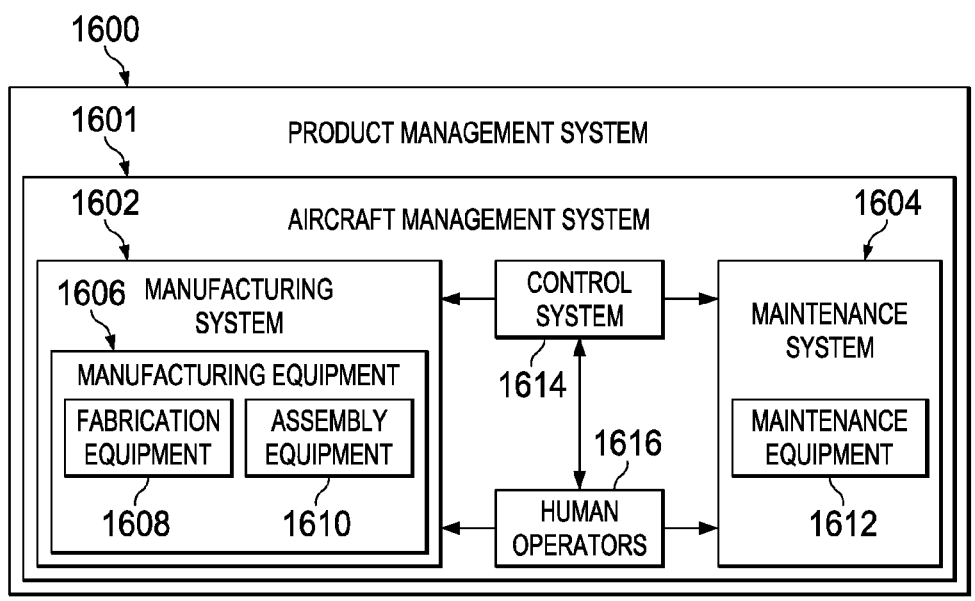
FIG. 16 is an illustration of a management system in the form of a block diagram in which an illustrative embodiment may be implemented.

Turning now to FIG. 16, an illustration of a management system is depicted in the form of a block diagram in accordance with an illustrative embodiment. Product management system 1600 is a physical hardware system. In this illustrative example, product management system 1600 may include at least one of manufacturing system 1602 or maintenance system 1604.

Manufacturing system 1602 is configured to manufacture products, such as, for example, without limitation, aircraft 1500 in FIG. 15. When manufacturing system 1602 is used to manufacture aircraft, such as aircraft 1500 in FIG. 15, product management system 1600 may be referred to as aircraft management system 1601.

As depicted, manufacturing system 1602 includes manufacturing equipment 1606. Manufacturing equipment 1606 may include at least one of fabrication equipment 1608 or assembly equipment 1610.

Fabrication equipment 1608 is equipment that may be used to fabricate components for parts used to form, for example, aircraft 1500. For example, fabrication equipment 1608 may include machines and tools. These machines and tools may include at least one of a drill, a hydraulic press, a furnace, a mold, a composite tape laying machine, a vacuum system, a lathe, or other types of machines or tools. Fabrication equipment 1608 may be used to fabricate at least one of metal parts, composite parts, semiconductors, circuits, fasteners, ribs, skin panels, spars, antennas, or other suitable types of parts.

Assembly equipment 1610 is equipment used to assemble parts to form aircraft 1500. In particular, assembly equipment 1610 may be used to assemble components and parts to form aircraft 1500. Assembly equipment 1610 also may include machines and tools. These machines and tools may include at least one of a robotic arm, a crawler, a fastener installation system, a rail-based drilling system, or other types of machines or tools. Assembly equipment 1610 may be used to assemble parts, such as, for example, without limitation, seats, horizontal stabilizers, wings, engines, engine housings, landing gear systems, and other parts for aircraft 1500.

In this illustrative example, maintenance system 1604 includes maintenance equipment 1612. Maintenance equipment 1612 may include any equipment needed to perform maintenance on a product, such as, for example, aircraft 1500. This maintenance may include performing different operations on parts on aircraft 1500 to perform routine maintenance, inspections, upgrades, refurbishment, other types of maintenance operations, or some combination thereof. As one illustrative example, maintenance equipment 1612 may be used to perform operations such as, but not limited to, at least one of disassembling parts, refurbishing parts, inspecting parts, reworking parts, manufacturing placement parts, or some other type of maintenance operation.

In one illustrative example, maintenance equipment 1612 may include ultrasonic inspection devices, x-ray imaging systems, vision systems, drills, crawlers, and other suitable device. In some cases, maintenance equipment 1612 may include fabrication equipment 1608, assembly equipment 1610, or both to produce and assemble parts that may be needed for maintenance.

Product management system 1600 also includes control system 1614. Control system 1614 is a hardware system and may also include software or other types of components. Control system 1614 is configured to control the operation of at least one of manufacturing system 1602 or maintenance system 1604. In particular, control system 1614 may control the operation of at least one of fabrication equipment 1608, assembly equipment 1610, or maintenance equipment 1612.

The hardware in control system 1614 may include, for example, without limitation, computers, circuits, networks, and other types of hardware equipment. In some cases, the control of manufacturing system 1602, maintenance system 1604, or both may take the form of direct control.

For example, robots, computer-controlled machines, and other equipment in manufacturing equipment 1606 may be directly controlled by control system 1614. In other illustrative examples, control system 1614 may be used to manage operations performed by human operators 1616 during the manufacturing or maintenance of aircraft 1500. For example, human operators 1616 may operate or interact with at least one of manufacturing equipment 1606, maintenance equipment 1612, or control system 1614.

In these illustrative examples, predictive system 124 from FIG. 1 may be implemented in control system 1614 to manage at least one of the manufacturing or maintenance of aircraft 1500 in FIG. 15. For example, predictive system 124 may be used to perform finite element analysis 148 in FIG. 1 to generate number of filler models 154 that may be used to manufacture number of filler members 122. Number of filler members 122 may be manufactured using, for example, manufacturing system 1602 to fill spaces between the shear ties of a rib assembly for a wing of aircraft 1500 and a wing skin.

Although product management system 1600 has been described with respect to manufacturing in the aerospace industry, product management system 1600 may be configured to manage products for other industries. For example, product management system 1600 may be configured to manufacture products for the automotive industry as well as any other suitable industries. Further, in other illustrative examples, product management system 1600 may be configured to manage other products other than aircraft 1500. For example, product management system 1600 may be configured to manage products, such as watercraft, spacecraft, buildings, equipment, and other types of products.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An apparatus comprising:
a surface model generator that generates a first surface model of a rigid surface and a second surface model of a flexible surface before the rigid surface and the flexible surface are mated to form a mated rigid surface and a mated flexible surface; and
an analyzer that performs a structural analysis using the first surface model and the second surface model to identify a predicted final shape of the mated flexible surface,
wherein the predicted final shape of the mated flexible surface is used to manufacture a number of filler members to fill a number of spaces between the mated rigid surface and the mated flexible surface;
wherein the first surface model and the second surface model are generated by scanning;
wherein at least one of a geometry of the flexible surface, dimensions of the flexible surface, a morphology of the flexible surface, and a three-dimensional shape of the flexible surface change after the second surface model is generated.

2. The apparatus of claim 1 further comprising:
a surface measurement system that generates first data for the rigid surface and second data for the flexible surface.

3. The apparatus of claim 2, wherein the surface model generator generates the first surface model using the first data and the second surface model using the second data.

4. The apparatus of claim 2, wherein the surface measurement system includes at least one of a laser system, an optical measurement device, or a photogrammetry system.

5. The apparatus of claim 1, wherein the analyzer performs the structural analysis using finite element analysis and a number of factors that includes at least one of a mating process for mating the rigid surface and the flexible surface, a number of forces to be applied to the flexible surface during the mating process, a number of boundary conditions, or gravity.

6. The apparatus of claim 1 further comprising:
a filler model generator that subtracts a shape of the mated rigid surface from the predicted final shape of the mated flexible surface to identify three-dimensional shape information for the number of spaces between the mated rigid surface and the mated flexible surface.

7. The apparatus of claim 6, wherein the filler model generator uses the three-dimensional shape information for the number of spaces to generate a number of filler models for the number of filler members.

8. The apparatus of claim 1, wherein the number of filler members is a number of shims.

9. The apparatus of claim 1, wherein the rigid surface is a discontinuous rigid surface of a rib assembly and the flexible surface is of a wing skin.

10. A predictive system comprising:
a surface measurement system that generates first data for a rigid surface and second data for a flexible surface before the rigid surface and the flexible surface are to be mated to become a mated rigid surface and a mated flexible surface;
a surface model generator that generates a first surface model of the rigid surface using the first data and a second surface model of the flexible surface using the second data;
an analyzer that performs a structural analysis using the first surface model and the second surface model to identify a predicted final shape of the mated flexible surface within selected tolerances; and
a filler model generator that subtracts a shape of the mated rigid surface from the predicted final shape of the mated flexible surface to identify three-dimensional shape information for a number of spaces and generates a number of filler models for a number of filler members to be used to fill the number of spaces present between the mated rigid surface and the mated flexible surface based on the three-dimensional shape information, wherein the number of filler members are manufactured;
wherein the first surface model and the second surface model are generated by scanning;
wherein at least one of a geometry of the flexible surface, dimensions of the flexible surface, a morphology of the flexible surface, and a three-dimensional shape of the flexible surface change after the second surface model is generated.

11. The predictive system of claim 10, wherein the surface measurement system includes at least one of a laser system, an optical measurement device, or a photogrammetry system.

12. The predictive system of claim 10, wherein the analyzer performs the structural analysis using finite element analysis and a number of factors that include at least one of a mating process for mating the rigid surface and the flexible surface, a number of forces to be applied to the flexible surface during the mating process, a number of boundary conditions, or gravity.

13. A method for forming a number of filler members, the method comprising:
scanning a rigid surface and a flexible surface;
generating a first surface model of the rigid surface and a second surface model of the flexible surface in which the rigid surface and the flexible surface are to be mated to form a mated rigid surface and a mated flexible surface;
performing a structural analysis using the first surface model and the second surface model to identify a predicted final shape of the mated flexible surface; and
subtracting a shape of the mated rigid surface from the predicted final shape of the mated flexible surface to identify three-dimensional shape information for the number of spaces between the mated rigid surface and the mated flexible surface;
generating a number of filler models for the number of filler members using the three-dimensional shape information identified; and
manufacturing the number of filler members based on the number of filler models;
manufacturing the mated rigid surface and the mated flexible surface using the number of filler members to fill a number of spaces between the mated rigid surface and the mated flexible surface;
wherein the first surface model and the second surface model are generated by scanning;

wherein at least one of a geometry of the flexible surface, dimensions of the flexible surface, a morphology of the flexible surface, and a three-dimensional shape of the flexible surface change after the second surface model is generated.

14. The method of claim 13 further comprising:
subtracting a shape of the mated rigid surface from the predicted final shape of the mated flexible surface to identify three-dimensional shape information for the number of spaces between the mated rigid surface and the mated flexible surface.

15. The method of claim 14, wherein manufacturing the number of filler members comprises:
forming the number of filler members using the three-dimensional shape information identified.

16. The method of claim 15, wherein forming the number of filler members using the three-dimensional shape information identified comprises:
generating a number of filler models for the number of filler members using the three-dimensional shape information identified; and
manufacturing the number of filler members based on the number of filler models.

17. The method of claim 13 further comprising:
generating first data for the rigid surface and second data for the flexible surface using a surface measurement system.

18. The method of claim 17, wherein generating the first data for the rigid surface and the second data for the flexible surface using the surface measurement system comprises:
generating the first data for the rigid surface and the second data for the flexible surface using the surface measurement system, wherein the surface measurement system includes at least one of a laser system, an optical measurement device, or a photogrammetry system.

19. The method of claim 17, wherein generating the first surface model of the rigid surface and the second surface model of the flexible surface comprises:
generating the first surface model of the rigid surface using the first data and the second surface model of the flexible surface using the second data.

20. The method of claim 13, wherein performing the structural analysis comprises:
performing the structural analysis using finite element analysis and a number of factors that includes at least one of a mating process for mating the rigid surface and the flexible surface, a number of forces to be applied to the flexible surface during the mating process, a number of boundary conditions, or gravity.

* * * * *

UNITED STATES PATENT AND TRADEMARK OFFICE
CERTIFICATE OF CORRECTION

PATENT NO.         : 9,990,446 B2
APPLICATION NO.    : 14/252997
DATED              : June 5, 2018
INVENTOR(S)        : Lagally et al.

Page 1 of 1

It is certified that error appears in the above-identified patent and that said Letters Patent is hereby corrected as shown below:

Column 20, Line 1, change "are to be mated" to --are mated--

Signed and Sealed this
Fourth Day of September, 2018

Andrei Iancu
*Director of the United States Patent and Trademark Office*